(12) United States Patent
Umeda

(10) Patent No.: US 9,461,616 B2
(45) Date of Patent: Oct. 4, 2016

(54) BULK WAVE RESONATOR HAVING AN ALUMINUM NITRIDE FILM CONTAINING SCANDIUM AND SCALN PROTECTIVE LAYER

(71) Applicant: MURATA MANUFACTURING CO., LTD., Nagaokakyo-shi, Kyoto-Fu (JP)

(72) Inventor: Keiichi Umeda, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 112 days.

(21) Appl. No.: 14/548,353
(22) Filed: Nov. 20, 2014

(65) Prior Publication Data

US 2015/0084719 A1    Mar. 26, 2015

Related U.S. Application Data

(63) Continuation of application No. PCT/JP2013/063303, filed on May 13, 2013.

(30) Foreign Application Priority Data

May 22, 2012 (JP) .................... 2012-116791

(51) Int. Cl.
| | |
|---|---|
| *H03H 9/17* | (2006.01) |
| *H03H 9/02* | (2006.01) |
| *H03H 9/54* | (2006.01) |

(52) U.S. Cl.
CPC ............ *H03H 9/171* (2013.01); *H03H 9/0211* (2013.01); *H03H 9/02015* (2013.01); *H03H 9/02086* (2013.01); *H03H 9/173* (2013.01); *H03H 9/547* (2013.01)

(58) Field of Classification Search
CPC ..................... H03H 9/02015; H03H 9/02086; H03H 9/132; H03H 9/171; H03H 9/173; H03H 9/174; H03H 9/587; H03H 9/588; H03H 9/0211; H03H 9/02118; H03H 9/547

USPC ........ 333/187, 189; 310/348, 349, 358, 363, 310/365, 367

See application file for complete search history.

(56) References Cited

U.S. PATENT DOCUMENTS 5,903,087 A * 5/1999 Mattson ................. H03H 9/132
                                                            310/327

(Continued)

FOREIGN PATENT DOCUMENTS

| CN | 180614 A | 7/2006 |
|---|---|---|
| JP | 01-157108 | * 6/1989 |

(Continued)

OTHER PUBLICATIONS

PCT/JP2013/063303 Written Opinion dated Jul. 8, 2013.

(Continued)

*Primary Examiner* — Barbara Summons
(74) *Attorney, Agent, or Firm* — Arent Fox LLP

(57) ABSTRACT

A bulk wave resonator that includes an aluminum nitride film containing scandium on a substrate, a first electrode disposed on one surface of the aluminum nitride film containing scandium, and a second electrode disposed on the other surface of the aluminum nitride film containing scandium. The aluminum nitride film containing scandium includes a portion acoustically isolated from a top surface of the substrate. The first electrode overlaps the second electrode with the aluminum nitride film containing scandium interposed therebetween. The overlap forms a piezoelectric vibrating portion. The scandium content of the aluminum nitride film containing scandium is 5 atomic percent or more and 43 atomic percent or less when Sc and Al of the aluminum nitride film containing scandium constitute 100 atomic percent.

12 Claims, 13 Drawing Sheets

(56) References Cited

U.S. PATENT DOCUMENTS

| | | | |
|---|---|---|---|
| 6,215,375 B1 | 4/2001 | Larson, III et al. | |
| 7,636,027 B2 * | 12/2009 | Mori | H03H 9/0211 310/334 |
| 7,649,304 B2 | 1/2010 | Umeda et al. | |
| 7,714,684 B2 * | 5/2010 | Ruby | H03H 3/02 310/322 |
| 8,896,395 B2 * | 11/2014 | Burak | H03H 9/131 333/187 |
| 2006/0103492 A1 | 5/2006 | Feng et al. | |
| 2008/0296529 A1 | 12/2008 | Akiyama et al. | |
| 2010/0013573 A1 * | 1/2010 | Umeda | H03H 9/0095 333/186 |
| 2012/0107557 A1 | 5/2012 | Akiyama et al. | |
| 2012/0299444 A1 | 11/2012 | Yokoyama et al. | |

FOREIGN PATENT DOCUMENTS

| | | |
|---|---|---|
| JP | 2000-332568 | 11/2000 |
| JP | 2006-109472 A | 4/2006 |
| JP | 2008-306280 A | 12/2008 |
| JP | 2009-010926 A | 1/2009 |
| JP | 2009-111623 A | 5/2009 |
| JP | 2009-149953 A | 7/2009 |
| JP | 2011-015148 A | 1/2011 |
| JP | 2011-160232 A | 8/2011 |
| WO | WO 2007/119556 | 10/2007 |
| WO | WO 2010/095640 A1 | 8/2010 |
| WO | WO-2011/099319 A1 | 8/2011 |

OTHER PUBLICATIONS

PCT/JP2013/063303 ISR dated Jul. 8, 2013.

* cited by examiner

BULK WAVE RESONATOR HAVING AN ALUMINUM NITRIDE FILM CONTAINING SCANDIUM AND SCALN PROTECTIVE LAYER

CROSS REFERENCE TO RELATED APPLICATIONS

The present application is a continuation of International application No. PCT/JP2013/063303, filed May 13, 2013, which claims priority to Japanese Patent Application No. 2012-116791, filed May 22, 2012, the entire contents of each of which are incorporated herein by reference.

FIELD OF THE INVENTION

The present invention relates to a bulk wave resonator that utilizes bulk waves propagating through a piezoelectric thin film.

BACKGROUND OF THE INVENTION

Various bulk wave resonators that utilize bulk waves propagating through a piezoelectric thin film have been proposed. For example, Patent Document 1 discloses an acoustic resonator filter that includes a first electrode on a first surface of a piezoelectric sheet and a second electrode on a second surface of the piezoelectric sheet. This acoustic resonator filter utilizes bulk waves that propagate through a piezoelectric sheet. In Patent Document 1, an overlap between the first electrode and the second electrode has an irregular polygonal shape so as to reduce transverse-mode spurious modes.

Patent Document 2 discloses a piezoelectric thin-film resonator that includes a mass addition film on an electrode in order to reduce spurious modes.

Patent Document 1:Japanese Unexamined Patent Application Publication No. 2000-332568

Patent Document 2:WO 2007/119556

SUMMARY OF THE INVENTION

Patent Documents 1 and 2 state that spurious modes can be reduced in the bulk wave resonators that utilize bulk waves. However, Patent Document 1 has the problems of a decreased Q-value and an increased loss. In Patent Document 2, spurious modes can be reduced in a frequency region equal to or higher than the resonant frequency. However, spurious modes cannot be reduced in a frequency region lower than the resonant frequency. Patent Document 2 also has the problem of a decreased Q-value.

It is an object of the present invention to provide a bulk wave resonator that can reduce spurious modes in a frequency region equal to or lower than the resonant frequency and has a high Q-value.

A bulk wave resonator according to the present invention includes a substrate, an aluminum nitride film containing scandium, a first electrode, and a second electrode. The aluminum nitride film containing scandium is fixed to one main surface of the substrate and includes a portion acoustically isolated from the one main surface. The first electrode is disposed on one surface of the aluminum nitride film containing scandium, and the second electrode is disposed on the other surface of the aluminum nitride film containing scandium. The second electrode overlaps the first electrode with the aluminum nitride film containing scandium interposed therebetween. In the present invention, the overlap between the first electrode and the second electrode constitutes a piezoelectric vibrating portion. The scandium content of the aluminum nitride film containing scandium ranges from 5 to 43 atomic percent when the scandium and aluminum of the aluminum nitride film containing scandium constitute 100 atomic percent.

In a bulk wave resonator according to one particular aspect of the present invention, the scandium content ranges from 15 to 24 atomic percent. This can impart satisfactory temperature characteristics to the bulk wave resonator and effectively reduce spurious modes.

In a bulk wave resonator according to another particular aspect of the present invention, the scandium content ranges from 37 to 39.5 atomic percent. This can increase the bandwidth and more effectively reduce spurious modes. This can also effectively stabilize the film quality of an aluminum nitride film containing scandium in the mass production thereof.

In a bulk wave resonator according to another particular aspect of the present invention, a mass addition film for adding mass to the piezoelectric vibrating portion is formed on at least part of the periphery of the piezoelectric vibrating portion. This can reduce spurious modes in a frequency region higher than the resonant frequency.

In a bulk wave resonator according to still another particular aspect of the present invention, the mass addition film is formed of the material of the second electrode. This can reduce the number of production processes and manufacturing costs.

In a bulk wave resonator according to still another particular aspect of the present invention, the piezoelectric vibrating portion has an elliptical planar shape. This can effectively reduce spurious modes due to transverse mode resonance.

In a bulk wave resonator according to still another particular aspect of the present invention, the piezoelectric vibrating portion has a polygonal planar shape that includes no parallel sides. This can effectively reduce spurious modes due to transverse mode resonance.

In a bulk wave resonator according to the present invention, since the scandium content of the aluminum nitride film containing scandium ranges from 5 to 43 atomic percent, spurious modes can be reduced in a frequency region equal to or lower than the resonant frequency. This can also suppress a decrease in Q-value and reduce the loss.

DETAILED DESCRIPTION OF THE PREFERRED EMBODIMENTS

The present invention will be further described in the following specific embodiments with reference to the attached drawings.

Figure 1A:
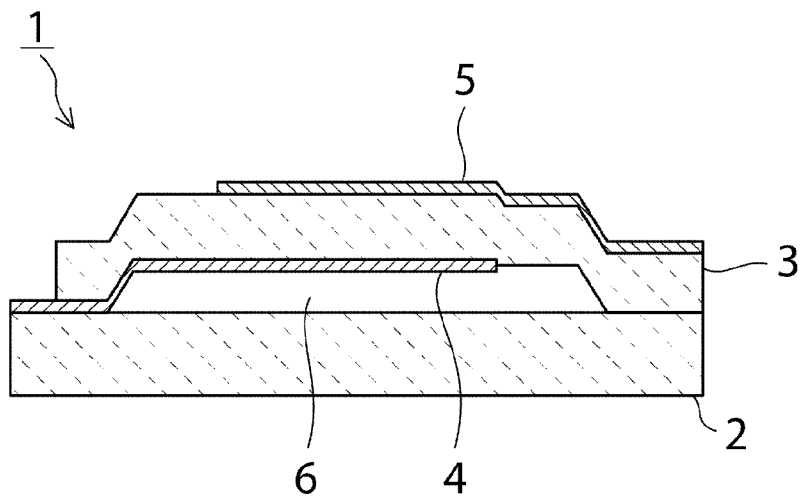
FIGS. 1(a) and 1(b) are a front cross-sectional view and a plan view of a bulk wave resonator according to a first embodiment of the present invention.
Figure 1B:
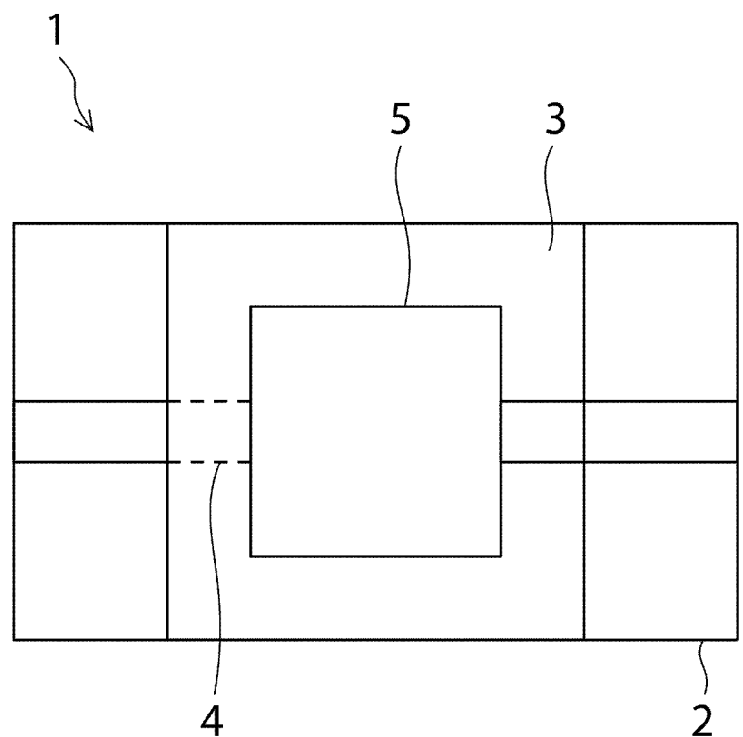

FIGS. 1(a) and 1(b) are a front cross-sectional view and a plan view of a bulk wave resonator according to a first embodiment of the present invention.

A bulk wave resonator 1 includes a substrate 2. The substrate 2 is made of an appropriate insulator or semiconductor. In the present embodiment, the substrate 2 is a silicon substrate. A ScAlN film 3 is disposed on the substrate 2. The ScAlN film 3 is formed as an aluminum nitride film containing scandium. The ScAlN film 3 is formed by doping an aluminum nitride film with scandium. The scandium content ranges from 5 to 43 atomic percent when the total Sc and Al content is 100 atomic percent.

The ScAlN film 3 is fixed to the top surface (a first main surface) of the substrate 2. The ScAlN film 3 is partly separated from the top surface of the substrate 2 with a space 6 interposed therebetween. The separated portion of the ScAlN film 3 is acoustically isolated from the substrate 2. Although the ScAlN film 3 is partly physically separated from the substrate 2 in the first embodiment, the present invention is not limited to this. For example, the ScAlN film 3 may be disposed on an acoustic reflecting layer, provided that the ScAlN film 3 is acoustically isolated from the substrate 2.

A first electrode 4 is disposed on the bottom surface of the ScAlN film 3. A second electrode 5 is disposed on the top surface of the ScAlN film 3. The first electrode 4 overlaps the second electrode 5 with the ScAlN film 3 interposed therebetween. In the present embodiment, the overlap between the first electrode 4 and the second electrode 5 has a square shape. As described below, the planar shape of the overlap between the first electrode 4 and the second electrode 5 is not limited to the square shape.

The overlap between the first electrode 4 and the second electrode 5 with the ScAlN film 3 interposed therebetween constitutes a piezoelectric vibrating portion. The piezoelectric vibrating portion is driven by applying an alternating electric field between the first electrode 4 and the second electrode 5. The bulk wave resonator 1 utilizes bulk waves produced by the driving.

The bulk wave resonator 1 is characterized in that the Sc content of the ScAlN film 3 ranges from 5 to 43 atomic percent, as described above. Thus, even when the first electrode 4 and the second electrode 5 have a square shape, spurious modes can be reduced in a frequency region equal to or lower than the resonant frequency, as described below. Furthermore, the bulk wave resonator 1 has a reduced loss in the vicinity of the resonant frequency and a high Q-value.

This will be described below with reference to FIGS. 2 to 4.

A bulk wave resonator having the following structure according to an example was manufactured as the bulk wave resonator 1 according to the present embodiment.

The Sc content of the ScAlN film was 35 atomic percent. The ScAlN film had a thickness of 0.9 μm. Each of the first electrode 4 and the second electrode 5 had a multilayer structure of Pt and Au and had a thickness of 0.12 μm. The piezoelectric vibrating portion was a 120 μm×120 μm square.

A bulk wave resonator according to Comparative Example 1 was prepared in the same manner as in the example except that an AlN film was used in place of the ScAlN film 3.

Figure 2:
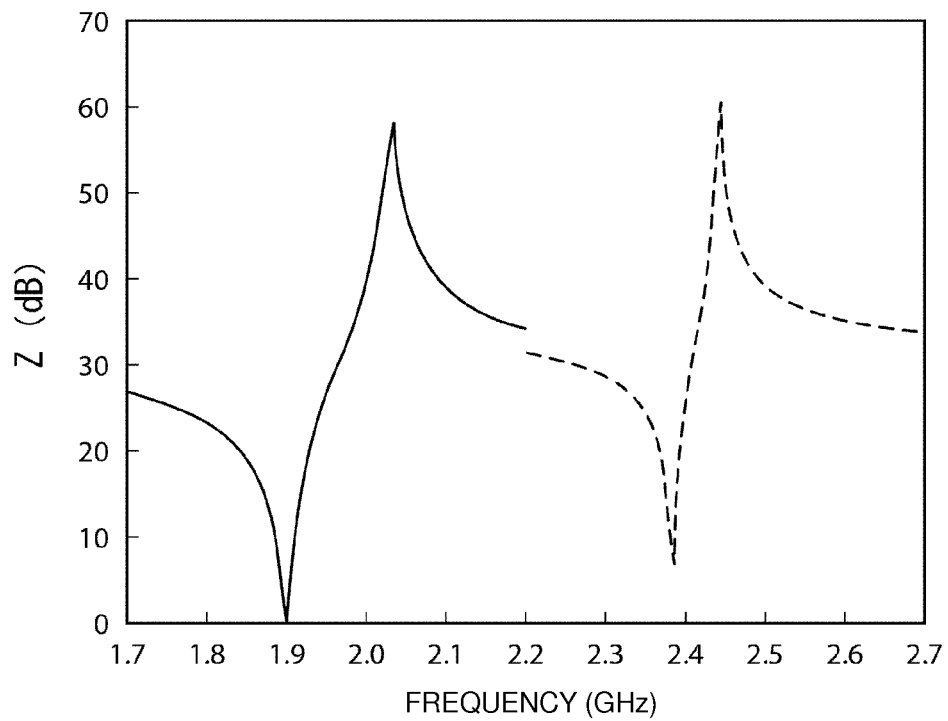
FIG. 2 is a graph of the resonance characteristics of a bulk wave resonator that includes a ScAlN film having a scandium content of 35 atomic percent according to an example and a bulk wave resonator that includes an AlN film according to Comparative Example 1.

In FIG. 2, the solid line represents the resonance characteristics of the bulk wave resonator according to the example, and the broken line represents the resonance characteristics of the bulk wave resonator according to Comparative Example 1.

Figure 3:
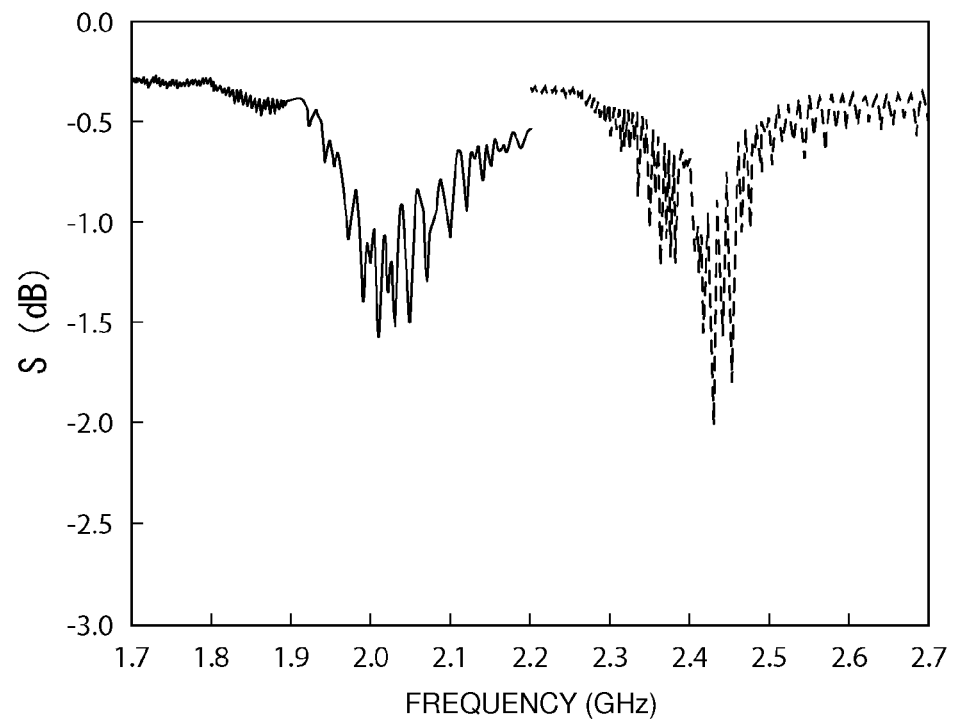
FIG. 3 is a graph of the reflection characteristics of a bulk wave resonator that includes a ScAlN film having a scandium content of 35 atomic percent according to an example and a bulk wave resonator that includes an AlN film according to Comparative Example 1.

In FIG. 3, the solid line represents the reflection characteristics of the bulk wave resonator 1 according to the example, and the broken line represents the reflection characteristics of the bulk wave resonator including the AlN film according to Comparative Example 1.

Figure 4:
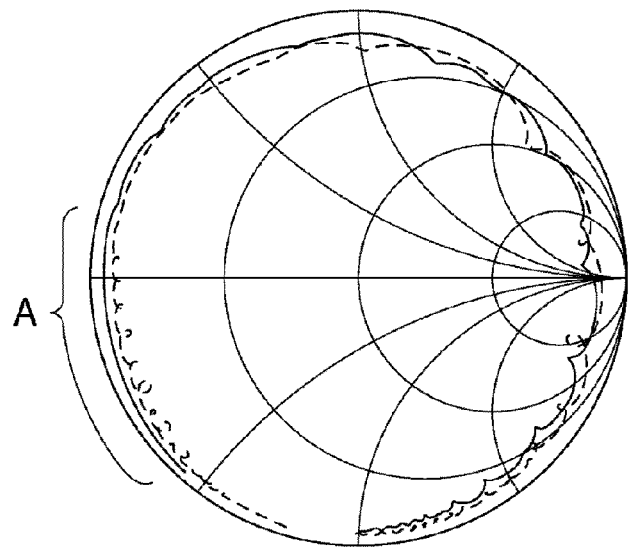
FIG. 4 is an impedance Smith chart of a bulk wave resonator that includes a ScAlN film having a scandium content of 35 atomic percent according to an example and a bulk wave resonator that includes an AlN film according to Comparative Example 1.

In FIG. 4, the solid line represents the impedance Smith chart of the bulk wave resonator 1 according to the example, and the broken line represents the impedance Smith chart of the bulk wave resonator according to Comparative Example 1.

As is clear from the broken line in FIG. 3, Comparative Example 1 has a large number of relatively large spurious modes in a frequency region equal to or lower than the resonant frequency 2.38 GHz. Likewise, in the region A in FIG. 4, that is, in a frequency region equal to or lower than the resonant frequency, Comparative Example 1 has many spurious modes. In contrast, as illustrated in FIG. 3, the bulk wave resonator 1 according to the example has few spurious modes in a frequency region equal to or lower than the resonant frequency 1.9 GHz. FIG. 4 also shows that the bulk wave resonator 1 according to the example has few spurious modes in a frequency region equal to or lower than the resonant frequency.

As is clear from FIGS. 2 to 4, the bulk wave resonator 1 can effectively reduce spurious modes in a frequency region equal to or lower than the resonant frequency.

As is clear from FIG. 3, the loss in the vicinity of the resonant frequency is smaller in the example than in Comparative Example. In other words, the example can have a high Q-value.

Thus, even when the first and second electrodes 4 and 5 of the bulk wave resonator 1 do not have a complex shape but have a square shape, the bulk wave resonator 1 can reduce spurious modes in a frequency region equal to or lower than the resonant frequency and have a high Q-value.

Figure 5:
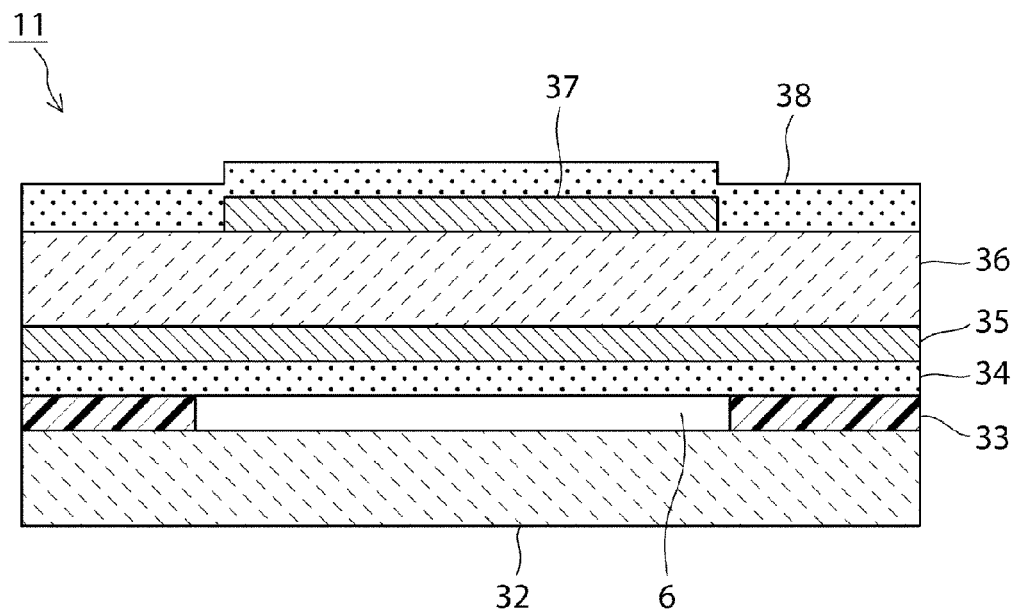
FIG. 5 is a front cross-sectional view of a bulk wave resonator according to a second embodiment of the present invention.

FIG. 5 is a front cross-sectional view of a bulk wave resonator 11 according to a second embodiment of the present invention. The bulk wave resonator 11 is substantially the same as the bulk wave resonator 1 according to the first embodiment except that the bulk wave resonator 11 includes a protective film, and the materials and the thickness of each layer are as described below.

The bulk wave resonator 11 includes a substrate 32 made of Si. A rectangular frame member layer 33 formed of silicon oxide is disposed on the top surface (a first main surface) of the substrate 32. A lower protective layer 34 formed of AlN is disposed on the frame member layer 33. The lower protective layer 34 closes a space 6. A first electrode 35 made of Mo is disposed on the lower protective layer 34. A ScAlN film 36 is disposed on the first electrode 35. A second electrode 37 is disposed on the ScAlN film 36. The second electrode 37 is made of Mo. The second electrode 37 is disposed over the space 6. The second electrode 37 over the space 6 overlaps the first electrode 35 with the ScAlN film interposed therebetween. This overlap constitutes a piezoelectric vibrating portion. The second electrode 37 and the ScAlN film 36 are covered with an upper protective layer 38. The upper protective layer 38 is formed of AlN. The lower protective layer and the upper protective layer may be formed of ScAlN, as described later. The lower protective layer and the upper protective layer may be formed of SiN or $SiO_2$ or may have a multilayer structure composed of SiN and $SiO_2$, instead of AlN. A $SiO_2$ film may be disposed between the upper Mo electrode and the piezoelectric ScAlN film or between the lower Mo electrode and the piezoelectric ScAlN film in order to significantly improve the frequency-temperature characteristics of the resonator.

In the bulk wave resonator 11, the ScAlN film 36 has a thickness of 1.0 µm. The Sc content is 37.5 atomic percent.

Each of the first electrode 4 and the second electrode 5 has a thickness of 0.2 µm.

Figure 6:
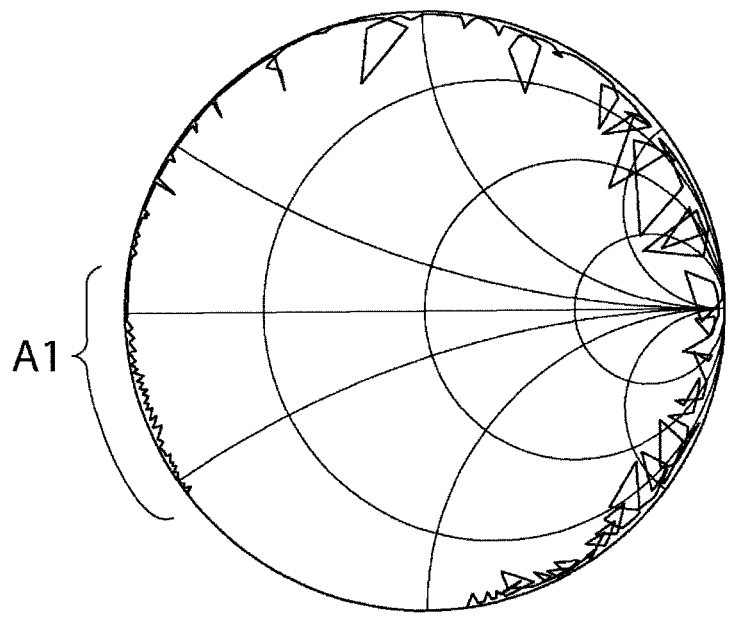
FIG. 6 is an impedance Smith chart of the bulk wave resonator according to the second embodiment.

FIG. 6 is an impedance Smith chart of the bulk wave resonator 11 according to the second embodiment. In the region A1 in FIG. 6, that is, in a frequency region of the resonant frequency and in a frequency region equal to or lower than the resonant frequency, spurious modes are also effectively reduced in the present embodiment. Furthermore, the bulk wave resonator 11 has a relatively high Q-value.

Figure 7:
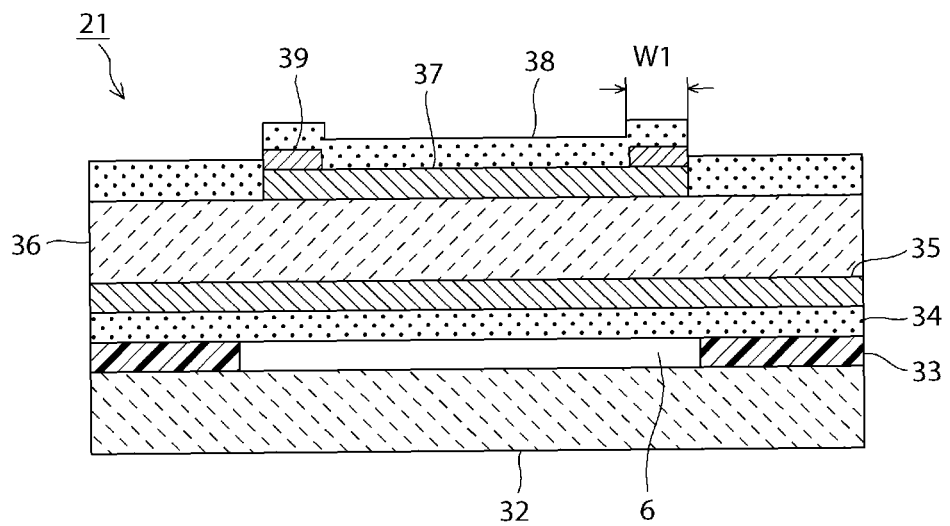
FIG. 7 is a front cross-sectional view of a bulk wave resonator according to a third embodiment of the present invention.

FIG. 7 is a front cross-sectional view of a bulk wave resonator 21 according to a third embodiment of the present invention. The bulk wave resonator 21 has the same structure as the bulk wave resonator 11 according to the second embodiment except that a mass addition film 39 is disposed on the second electrode 37. The mass addition film 39 has a square frame shape. The mass addition film 39 is disposed along the periphery of the piezoelectric vibrating portion. The square frame-shaped mass addition film is not necessarily disposed along the entire periphery of the piezoelectric vibrating portion. The square frame may be partly lacking.

The mass addition film 39 may be a Mo, W, AlN, or silicon oxide film. The mass addition film 39 has a width W1 of 2 µm. One side of the outer side portion of the square frame-shaped mass addition film 39 has a length of 100 µm.

The overlap between the first electrode 35 and the second electrode 37 is a 100 µm×100 µm square. This square is circumscribed by the square frame-shaped mass addition film 39. The lower protective layer 34 is formed of ScAlN and has a film thickness of 50 nm. The first electrode 35 is formed of Mo and has a film thickness of 250 nm. The ScAlN 36 has a film thickness of 970 nm. The second electrode 37 is formed of Mo and has a film thickness of 250 nm. The mass addition film 39 is formed of Mo and has a film thickness of 180 nm. The upper protective layer 38 is formed of ScAlN and has a film thickness of 100 nm. The lower protective layer 34 and the upper protective layer 38 may be formed of AlN. The lower protective layer 34 and the upper protective layer 38 formed of ScAlN can have higher adhesion with ScAlN and higher crystallinity than the lower protective layer 34 and the upper protective layer 38 formed of AlN. This is probably because AlN and ScAlN have different interatomic distances in their crystal structures, and the lower protective layer 34 and the upper protective layer 38 formed of AlN have low adhesion and crystallinity.

Figure 8:
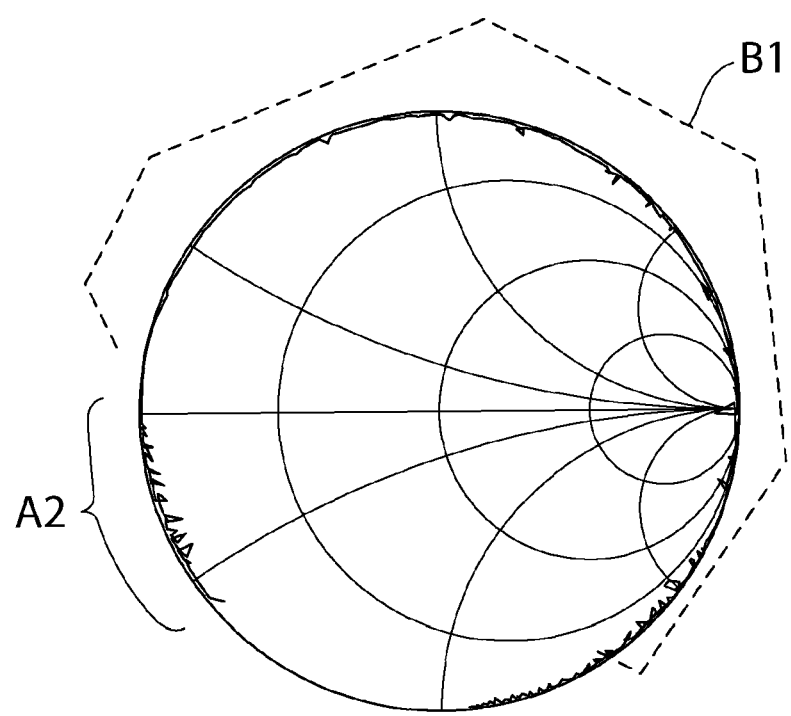
FIG. 8 is an impedance Smith chart of the bulk wave resonator according to the third embodiment.

Except for that, the bulk wave resonator 21 has the same structure as the bulk wave resonator 11 according to the second embodiment. FIG. 8 is an impedance Smith chart of the bulk wave resonator 21 according to the third embodiment.

As is clear from FIG. 8, in a frequency region A2 equal to or lower than the resonant frequency, spurious modes are small, and a decrease in Q-value is not observed.

Also in a frequency region B1 of the bulk wave resonator 21 higher than the resonant frequency represented by the broken line, a decrease in Q-value is negligible, and spurious modes can be effectively reduced. Thus, the mass addition film 39 can reduce spurious modes over a wide frequency range.

Figure 9:
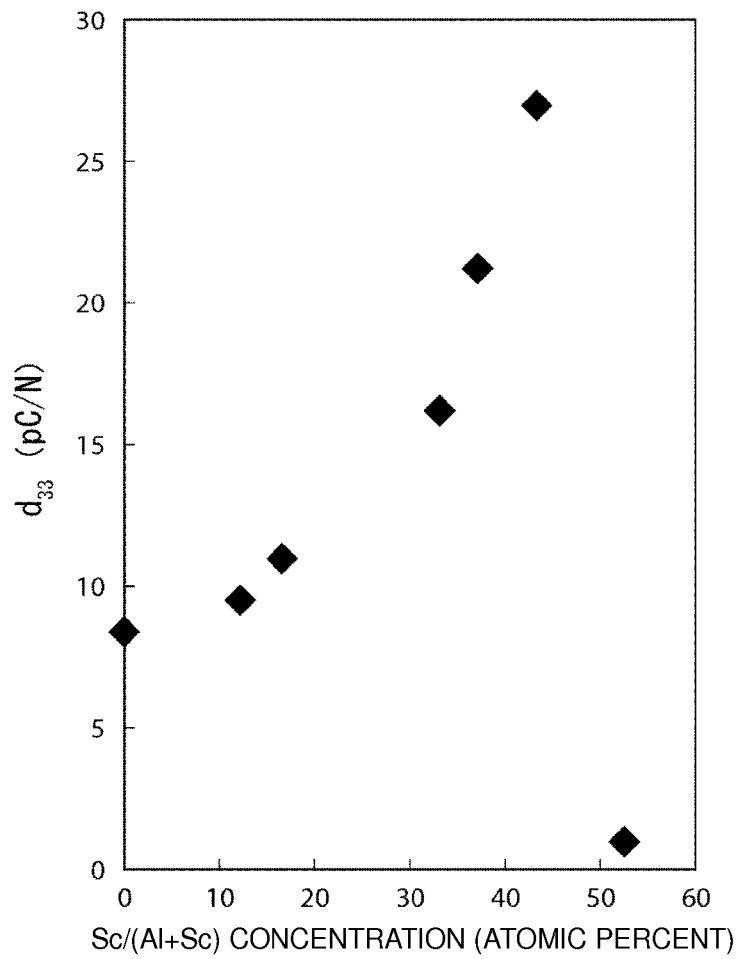
FIG. 9 is a graph of the relationship between the scandium content and the piezoelectric constant $d_{33}$.

The Sc content was 35 atomic percent in the example according to the first embodiment and 37.5 atomic percent in the second and third embodiments. The present inventors determined the relationship between the piezoelectric constant $d_{33}$, which represents the piezoelectricity, and the Sc content of the ScAlN film. FIG. 9 shows the results.

As is clear from FIG. 9, as the Sc content increases from 0 atomic percent to 43 atomic percent, the piezoelectric constant $d_{33}$ increases gradually. In particular, at a Sc content of 13 atomic percent or more, the piezoelectric constant $d_{33}$ increases significantly with the Sc content. At a Sc content of more than 43 atomic percent, however, the piezoelectric constant $d_{33}$ decreases sharply. As described above, at a Sc content of 43 atomic percent or less, the piezoelectric constant $d_{33}$ increases with the Sc content. This is probably because substitution of Sc for Al expands the crystal lattice of ScAlN in the a-axis direction and facilitates the movement of the Al atom in the c-axis direction. In other words, ScAlN in the c-axis direction becomes soft.

Figure 22:
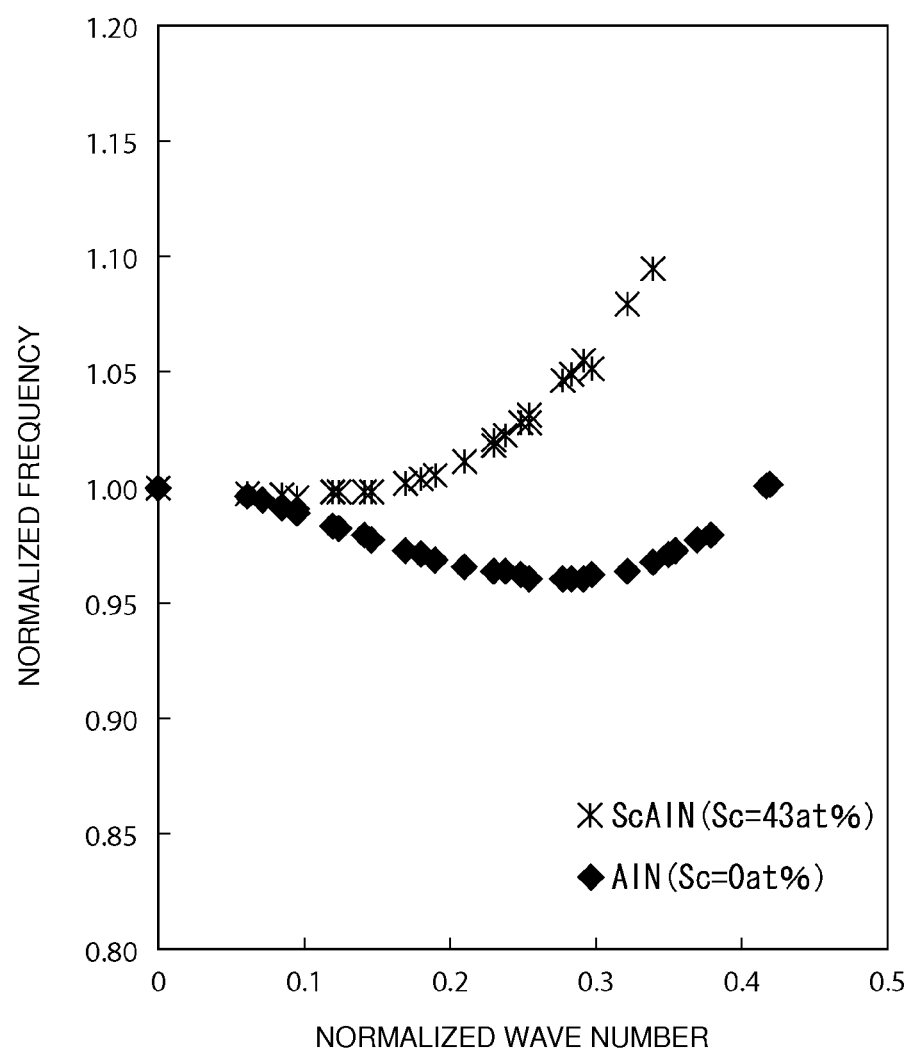
FIG. 22 is a graph of the dispersion characteristics of plate waves that propagate through AlN and ScAlN.

FIG. 22 shows the dispersion characteristics of plate waves that propagate through ScAlN (the Sc content: 43 atomic percent) and AlN. The X axis represents the wave number normalized with respect to the film thickness. The Y axis represents the frequency normalized with respect to the resonant frequency. As shown in FIG. 22, AlN has many propagation modes in a frequency region equal to or lower than the resonant frequency. In contrast, the dispersion characteristics of ScAlN extend almost horizontally from the resonant frequency, and ScAlN has few propagation modes in a frequency region equal to or lower than the resonant frequency. Thus, the bulk wave resonator including ScAlN has few spurious modes in a frequency region equal to or lower than the resonant frequency. Such a difference in dispersion characteristics probably results from a decrease in the elastic constant in the thickness direction (c33 direction) due to the inclusion of Sc.

Figure 10:
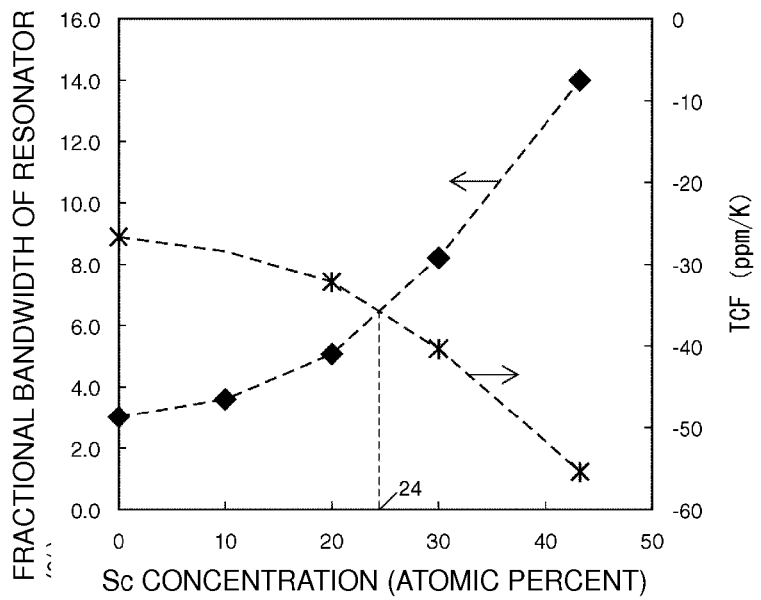
FIG. 10 is a graph of the fractional bandwidth of a bulk wave resonator and the temperature coefficient of resonant frequency TCF as a function of the Sc content.

FIG. 10 is a graph of the fractional bandwidth of a resonator (%) and the temperature coefficient of resonant frequency TCF (ppm/K) as a function of the Sc content of ScAlN in the bulk wave resonator 1.

As is clear from FIG. 10, it is desirable that the Sc content be 24 atomic percent or less in order to achieve a wide bandwidth and satisfactory temperature characteristics.

Figure 12:
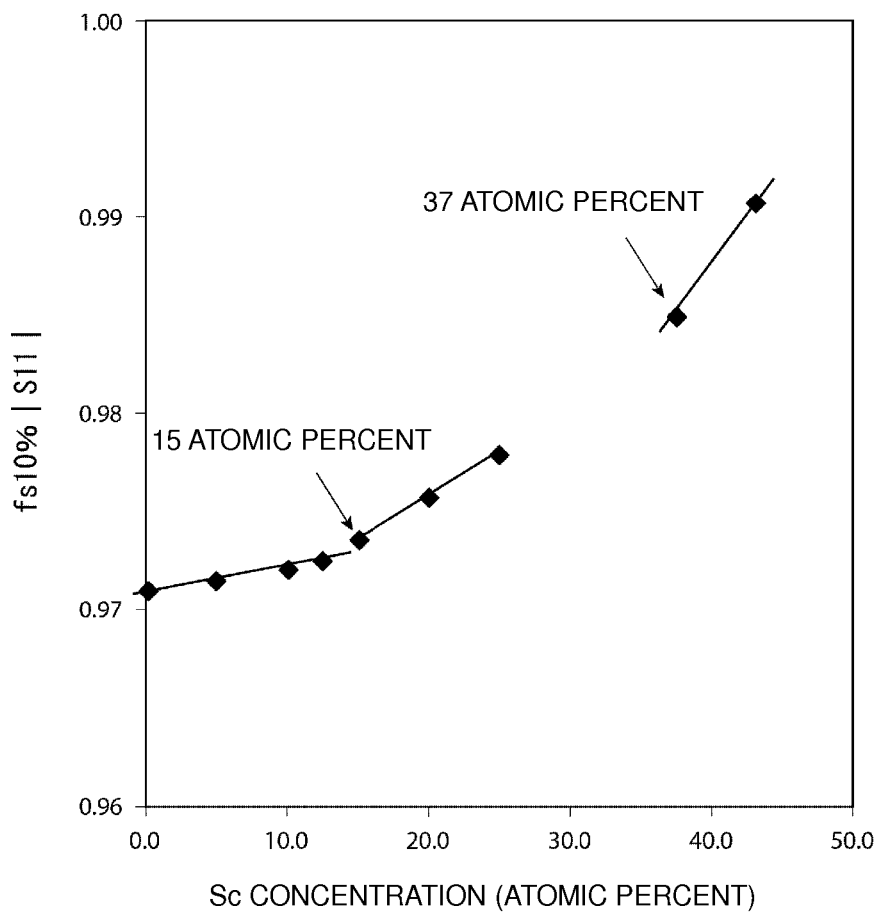
FIG. 12 is a graph of the relationship between the Sc content and the loss factor.
Figure 13:
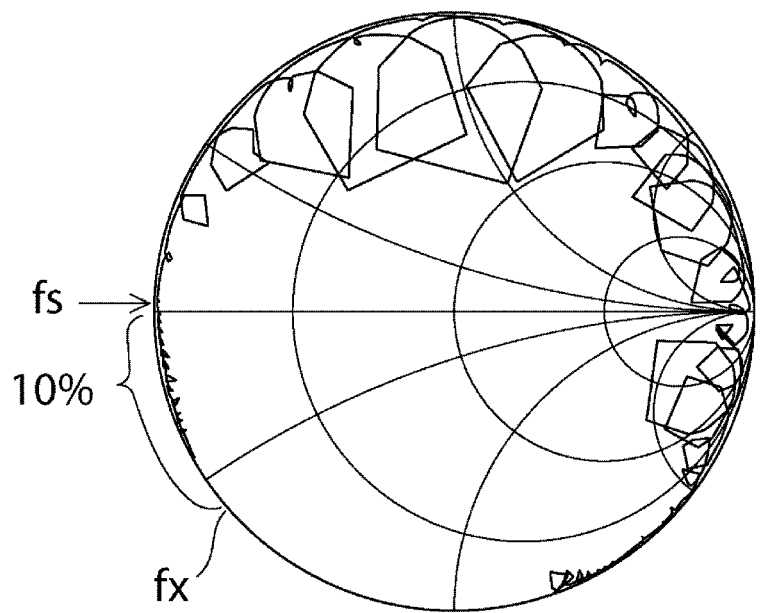
FIG. 13 is an impedance Smith chart illustrating a section for determining the loss factor shown in FIG. 12.

The present inventors then changed the Sc content and determined the relationship between the Sc content and the loss factor in the bulk wave resonator 1. FIG. 12 shows the results. The vertical axis in FIG. 12 represents the loss factor fs10(%) (S11). The fs10(%) (S11) will be described below with reference to FIG. 13. FIG. 13 is an impedance Smith chart for the bulk wave resonator 1 in which the Sc content of ScAlN is 37.5 atomic percent. The reflection coefficient S11 was employed as an indicator for the energy loss of a resonator. A reflection coefficient S11 of 1.0 means no energy loss. The arrow fs in FIG. 13 indicates the position of the resonant frequency. The average of the reflection coefficient S11 was determined in a frequency region of 10% of the resonant frequency or less. This is the vertical axis fs10(%) in FIG. 12. More specifically, the fs10(%) (S11) is the average of S11 in a frequency region between the resonant frequency fs and 0.9fs=fx.

As is clear from FIG. 12, at a Sc content of 15 atomic percent or more, the return loss decreases significantly with increasing Sc content. Thus, in the present invention, the Sc content is preferably 15 atomic percent or more. In this case, the return loss can be significantly decreased. Thus, in the present invention, the Sc content ranges from 5 to 43 atomic percent, as described above. Preferably, the Sc content ranges from 15 to 43 atomic percent.

As described above with reference to FIG. 10, the Sc content is preferably 24 atomic percent or less in order to achieve satisfactory temperature characteristics and a wide bandwidth. Thus, in the present invention, the Sc content preferably ranges from 15 to 24 atomic percent. This can achieve satisfactory temperature characteristics, a wide bandwidth, and a small return loss.

Figure 11:
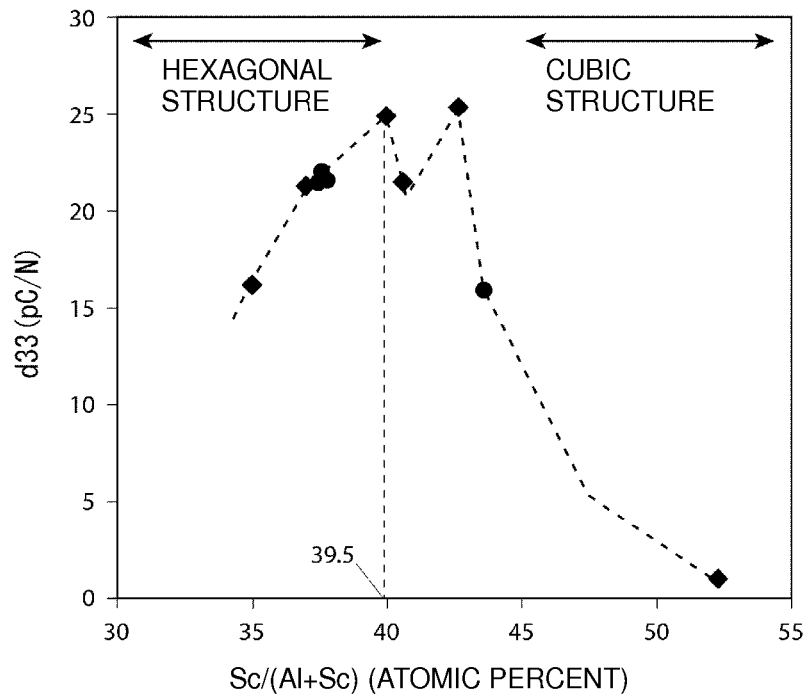
FIG. 11 is a graph of the relationship between the scandium content and the piezoelectric constant $d_{33}$.

FIG. 11 illustrates the relationship between the Sc content and the piezoelectric constant $d_{33}$. FIG. 11 corresponds to a magnification of a high Sc content region of the graph shown in FIG. 9.

As is clear from FIG. 11, the piezoelectric constant $d_{33}$ varies widely with the Sc content when the Sc content is 40 atomic percent or more and 45 atomic percent or less. The ScAlN film has a hexagonal structure at a Sc content of less than 40 atomic percent. When the Sc content exceeds 45 atomic percent, the ScAlN film has a cubic structure after phase transition. The phase transition occurs at a Sc content in the range of 40 to 45 atomic percent, and the crystal structure is therefore very unstable in this range. Probably for that reason, the $d_{33}$ varies widely as described above.

In the present invention, therefore, the Sc content is preferably 39.5 atomic percent or less, as shown in FIG. 11, and the loss factor can be significantly decreased when the Sc content is 37 atomic percent or more, as shown in FIG. 12. Thus, the Sc content more preferably ranges from 37 to 39.5 atomic percent in order to more effectively widen the bandwidth and reduce spurious modes. Furthermore, this can effectively stabilize the quality of the ScAlN film in the mass production thereof.

Figure 14:
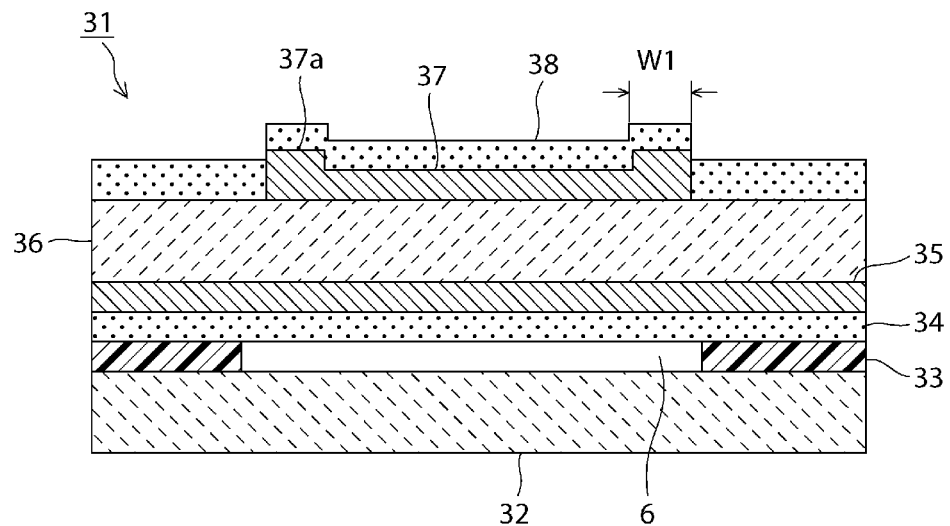
FIG. 14 is a front cross-sectional view of a bulk wave resonator according to a fourth embodiment of the present invention.

FIG. 14 is a front cross-sectional view of a bulk wave resonator according to a fourth embodiment of the present invention.

A bulk wave resonator 31 includes a substrate 32 made of Si. A rectangular frame member layer 33 formed of silicon oxide is disposed on the top surface (a first main surface) of the substrate 32. A lower protective layer 34 formed of AlN is disposed on the frame member layer 33. The lower protective layer 34 closes a space 6. A first electrode 35 made of Mo is disposed on the lower protective layer 34. A ScAlN film 36 is disposed on the first electrode 35. A second electrode 37 is disposed on the ScAlN film 36. The second electrode 37 is made of Mo. The second electrode 37 is disposed over the space 6. The second electrode 37 over the space 6 overlaps the first electrode 35 with the ScAlN film interposed therebetween. This overlap constitutes a piezoelectric vibrating portion. The second electrode 37 and the ScAlN film 36 are covered with an upper protective layer 38. The upper protective layer 38 is formed of AlN. The lower protective layer and the upper protective layer formed of AlN can protect the vibrating portion composed of electrode/ScAlN piezoelectric film/electrode from hydrofluoric acid in a process of etching a sacrificial layer in the structure illustrated in FIG. 14 in which silicon oxide is used as the sacrificial layer. Thus, in order to improve the adhesion of the ScAlN piezoelectric thin film, the lower protective layer is preferably a multilayer body of AlN and ScAlN layered in this order from the bottom thereof.

In the present embodiment, a square frame protrusion that functions as a mass addition film 37a is disposed on the periphery of the second electrode 37. The mass addition film 37a is formed of the material of the second electrode 37. Thus, no additional material is required for the formation of the mass addition film. This results in cost reduction.

In the bulk wave resonator 31, the Sc content of the ScAlN film 36 was 43 atomic percent. The ScAlN film 36 had a film thickness of 970 nm. Each of the first electrode 35 and the second electrode 37 had a thickness of 250 nm. The square frame protrusion that functioned as the mass addition film 37a, that is, the protrusion from the top surface of the second electrode 37 had a height of 180 nm, a width W1 of 2 μm, and an external shape of a 100 μm×100 μm square.

For comparison purposes, a bulk wave resonator according to Comparative Example 2 was manufactured in the same manner except that an AlN film was used in place of the ScAlN film 36.

Figure 15:
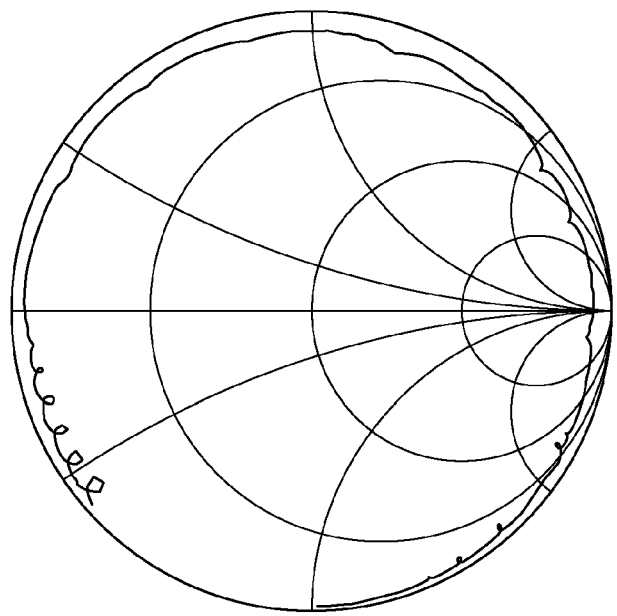
FIG. 15 is an impedance Smith chart of a bulk wave resonator that includes an AlN film according to Comparative Example 2.
Figure 16:
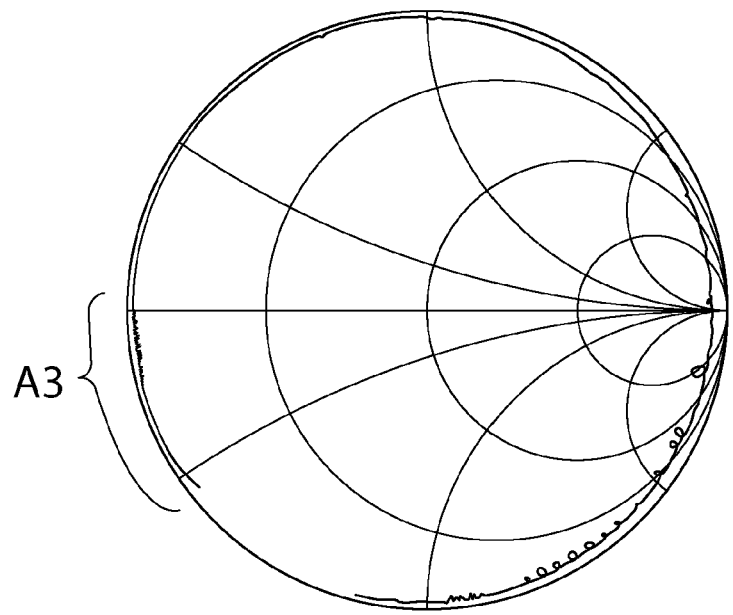
FIG. 16 is an impedance Smith chart of the bulk wave resonator according to the fourth embodiment.

FIG. 15 is an impedance Smith chart of the bulk wave resonator according to Comparative Example 2. FIG. 16 is an impedance Smith chart of the bulk wave resonator 31 according to the present embodiment. As is clear from a comparison between FIG. 15 and FIG. 16, the present embodiment can also effectively reduce spurious modes in a frequency region A3 equal to or lower than the resonant frequency and suppress a decrease in Q-value.

Figure 17A:
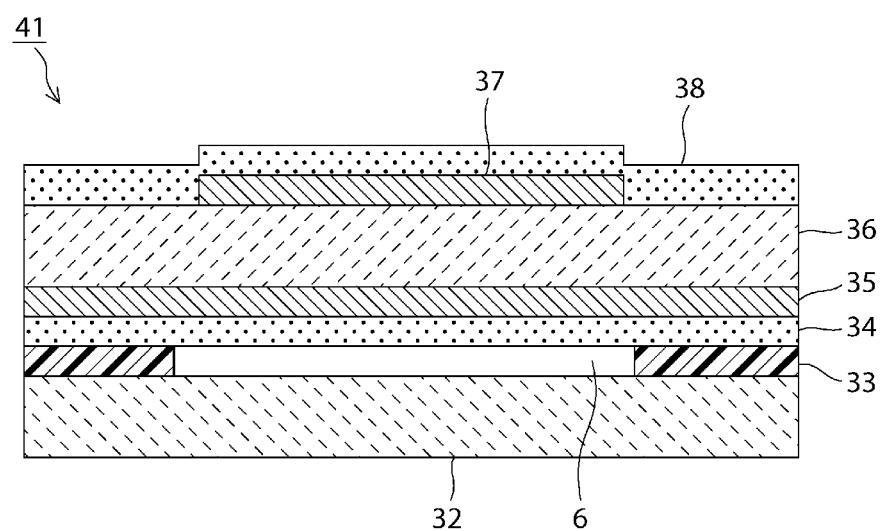
FIG. 17(a) is a front cross-sectional view of a bulk wave resonator according to a fifth embodiment of the present invention.
Figure 17B:
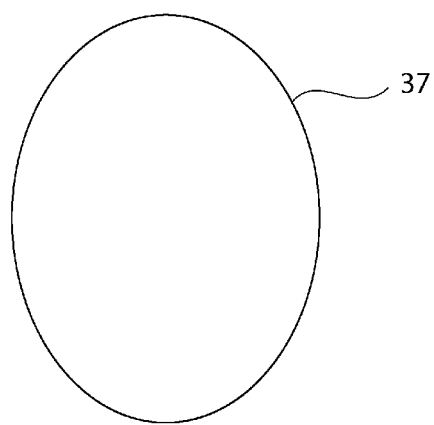
FIG. 17(b) is a plan view of a second electrode.

FIG. 17(a) is a front cross-sectional view of a bulk wave resonator according to a fifth embodiment of the present invention, and FIG. 17(b) is a plan view of a second electrode.

Like reference numerals designate like components in FIG. 17(a) and FIG. 14. More specifically, a bulk wave resonator 41 illustrated in FIG. 17(a) is the same as the bulk wave resonator 31 illustrated in FIG. 14 except that the bulk wave resonator 41 includes no mass addition film 37a, and the second electrode 37 is elliptical, as shown in FIG. 17(b). The other components are described above with respect to the bulk wave resonator 31.

In the present embodiment, since the second electrode 37 is elliptical, a piezoelectric vibrating portion in which the second electrode 37 overlaps the first electrode 35 with the ScAlN film 36 interposed therebetween has an elliptical planar shape.

Also in the present embodiment, the Sc content of the ScAlN film 36 is 43 atomic percent.

A bulk wave resonator according to Comparative Example 3 was prepared in the same manner as in the present embodiment except that an AlN film was used in place of the ScAlN film 36.

Figure 18:
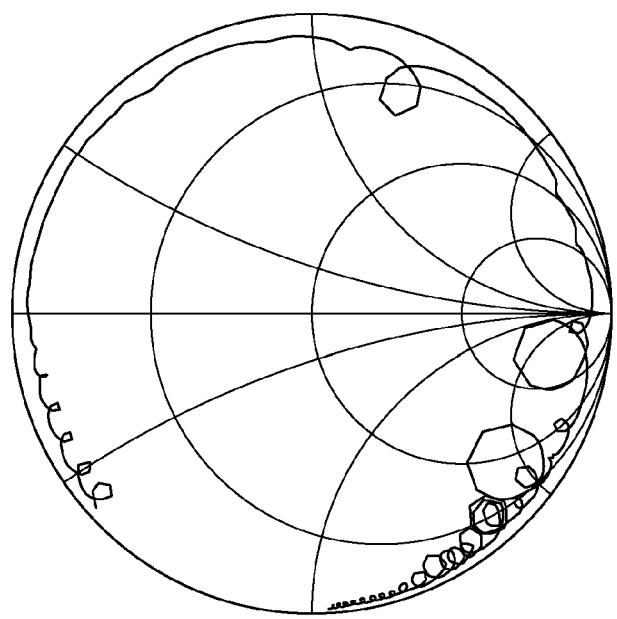
FIG. 18 is an impedance Smith chart of a bulk wave resonator that includes an AlN film according to Comparative Example 3.
Figure 19:
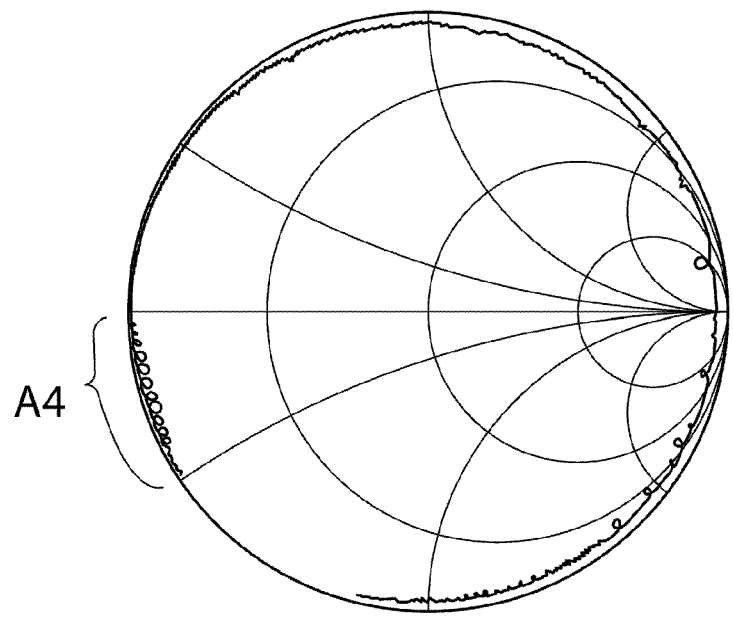
FIG. 19 is an impedance Smith chart of the bulk wave resonator according to the fifth embodiment.

FIG. 18 is an impedance Smith chart of the bulk wave resonator according to Comparative Example 3. FIG. 19 is an impedance Smith chart of the bulk wave resonator 41 according to the present embodiment.

In FIG. 19, in contrast to FIG. 18, spurious modes are sufficiently reduced in a frequency region A4 equal to or lower than the resonant frequency, and a decrease in Q-value is negligible.

As is clear from a comparison between FIG. 16 and FIG. 19, in the bulk wave resonator 31 according to the fourth embodiment illustrated in FIG. 16, spurious modes can be effectively reduced also in a frequency region equal to or higher than the resonant frequency. This is because of the mass addition film 37a, as described above.

FIG. 19 shows that spurious modes are sufficiently reduced also in a frequency region equal to or higher than the resonant frequency. More specifically, although the loss is increased and the Q-value is slightly decreased in the frequency region equal to or higher than the resonant frequency, spurious modes can be reduced also in the frequency region equal to or higher than the resonant frequency. This is probably because the second electrode does not include a pair of parallel sides, and therefore spurious modes can be reduced in a wide frequency range.

Thus, the planar shape of the piezoelectric vibrating portion may not include a pair of parallel sides in order to reduce spurious modes in a wide frequency range. Examples of such a shape are illustrated in FIGS. 20(a) to 20(d).

Figure 20A:
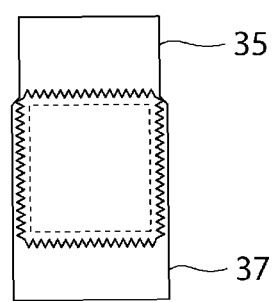
FIGS. 20(a) to 20(d) are schematic plan views of modified examples of a piezoelectric vibrating portion and an electrode shape.

In FIG. 20(a), fine asperities are disposed around the piezoelectric vibrating portion in an overlap between the first electrode 35 and the second electrode 37. More specifically, asperities are partly disposed around the periphery of the first electrode 35 and the second electrode 37 such that the piezoelectric vibrating portion has fine asperities around the outer periphery.

Figure 20B:
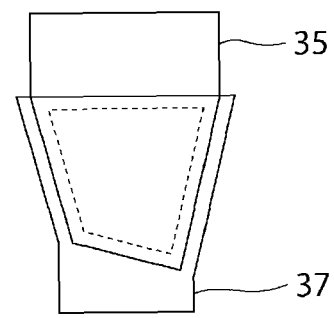
Figure 20C:
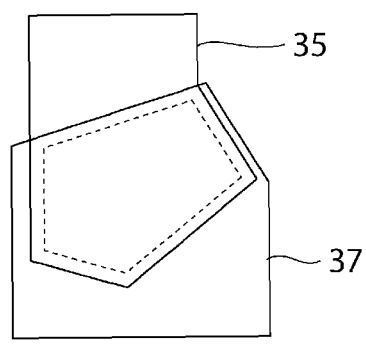

In FIG. 20(b), a piezoelectric vibrating portion in which the first electrode 35 overlaps the second electrode 37 is a trapezium. In FIG. 20(c), an overlap between the first electrode 35 and the second electrode 37 is an irregular pentagon. In the case where the planar shape of the piezoelectric vibrating portion is a polygonal shape not having a pair of parallel sides, the planar shape of the piezoelectric vibrating portion may be appropriately changed.

Figure 20D:
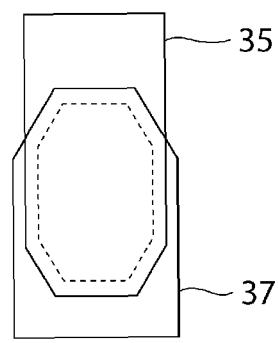

In FIG. 20(d), the first and second electrodes 35 and 37 are disposed such that the planar shape of the piezoelectric vibrating portion is an octagon other than a regular octagon. In this case, the planar shape of the piezoelectric vibrating portion includes a plurality of pairs of parallel sides. However, since the planar shape of the piezoelectric vibrating portion is not a regular octagon, spurious modes can be reduced in a wider frequency range than the case where the planar shape of the piezoelectric vibrating portion is a regular octagon.

Figure 21:
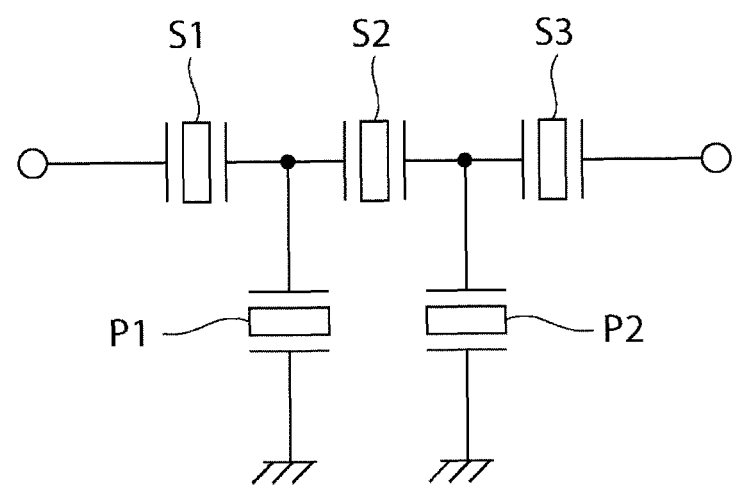
FIG. 21 is a circuit diagram of a filter device that includes a bulk wave resonator according to the present invention.

A bulk wave resonator according to the present invention can be used as a resonator in various applications. For example, a bulk wave resonator according to the present invention can be suitably used for series arm resonators S1 to S3 and parallel arm resonators P1 and P2 in a ladder filter illustrated in FIG. 21. Thus, in accordance with the present invention, as described above, a resonator according to the present invention that has a high Q-value and can effectively reduce spurious modes in a frequency region equal to or lower than the resonant frequency can be used to provide various filter devices and duplexers that include the filter devices.

REFERENCE SIGNS LIST 1 bulk wave resonator
2 substrate
3 ScAlN film
4, 5 first and second electrodes
6 space
7 mass addition film
11, 21, 31 bulk wave resonators
32 substrate
33 frame member layer
34 lower protective layer
35, 37 first and second electrodes
36 ScAlN film
37a mass addition film
38 upper protective layer
39 mass addition film
41 bulk wave resonator
P1, P2 parallel arm resonators
S1 to S3 series arm resonators

The invention claimed is:
1. A bulk wave resonator, comprising:
a substrate;
a frame member layer on the substrate;
a first ScAlN protective layer on the frame member and defining a space between the substrate, the frame member and the first ScAlN protective layer;
a first electrode on the first ScAlN protective layer;
an aluminum nitride film containing scandium on the first electrode and including a portion acoustically isolated from a surface of the substrate and partly separated from the surface of the substrate by the space;
a second electrode on the aluminum nitride film and extending over the space, the second electrode overlapping with the first electrode with the aluminum nitride film containing scandium interposed therebetween, and the overlap between the first electrode and the second electrode is a piezoelectric vibrating portion; and
a second ScAlN protective layer covering the second electrode and the aluminum nitride film, the scandium content of the aluminum nitride film ranges from 5 to 43 atomic percent when the scandium and aluminum of the aluminum nitride film are 100 atomic percent.

2. The bulk wave resonator according to claim 1, wherein the scandium content of the aluminum nitride film ranges from 15 to 24 atomic percent.

3. The bulk wave resonator according to claim 1, wherein the scandium content of the aluminum nitride film ranges from 37 to 39.5 atomic percent.

4. The bulk wave resonator according to claim 1, further comprising a mass addition film disposed on at least part of a periphery of the piezoelectric vibrating portion.

5. The bulk wave resonator according to claim 4, wherein the mass addition film is of a same material as that of the second electrode.

6. The bulk wave resonator according to claim 1, wherein the piezoelectric vibrating portion has an elliptical planar shape.

7. The bulk wave resonator according to claim 1, wherein the piezoelectric vibrating portion has a polygonal planar shape that includes no parallel sides.

8. The bulk wave resonator according to claim 1, wherein the frame member layer is made of silicon oxide.

9. The bulk wave resonator according to claim 1, wherein the first electrode and the second electrode are made of Mo.

10. The bulk wave resonator according to claim 1, wherein the piezoelectric vibrating portion has asperities around a periphery thereof.

11. The bulk wave resonator according to claim 1, wherein the piezoelectric vibrating portion has a shape that includes a plurality of parallel sides.

12. The bulk wave resonator according to claim 1, wherein the aluminum nitride film has a hexagonal shape.

* * * * *